(12) United States Patent
Suzuki et al.

(10) Patent No.: US 12,012,480 B2
(45) Date of Patent: Jun. 18, 2024

(54) EPOXY RESIN PHOTOSENSITIVE COMPOSITION FOR OPTICAL WAVEGUIDE, PHOTOSENSITIVE FILM FOR OPTICAL WAVEGUIDE, OPTICAL WAVEGUIDE, AND OPTO-ELECTRIC HYBRID BOARD

(71) Applicant: NITTO DENKO CORPORATION, Osaka (JP)

(72) Inventors: Kazuaki Suzuki, Osaka (JP); Shinya Ota, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 50 days.

(21) Appl. No.: 17/312,167

(22) PCT Filed: Nov. 27, 2019

(86) PCT No.: PCT/JP2019/046428
§ 371 (c)(1),
(2) Date: Jun. 9, 2021

(87) PCT Pub. No.: WO2020/121818
PCT Pub. Date: Jun. 18, 2020

(65) Prior Publication Data
US 2022/0017686 A1    Jan. 20, 2022

(30) Foreign Application Priority Data
Dec. 11, 2018 (JP) .................. 2018-231451

(51) Int. Cl.
C08G 59/38 (2006.01)
G02B 6/42 (2006.01)

(52) U.S. Cl.
CPC ........... *C08G 59/38* (2013.01); *G02B 6/4212* (2013.01)

(58) Field of Classification Search
None
See application file for complete search history.

(56) References Cited

U.S. PATENT DOCUMENTS

2010/0019271 A1  1/2010  Ota et al.
2010/0184923 A1  7/2010  Yoshida et al.
(Continued)

FOREIGN PATENT DOCUMENTS

JP  2007-031555 A  2/2007
JP  2008-009150 A  1/2008
(Continued)

OTHER PUBLICATIONS

International Preliminary Report on Patentability issued by WIPO dated Jun. 8, 2021, in connection with International Patent Application No. PCT/JP2019/046428.
(Continued)

*Primary Examiner* — Megan McCulley
(74) *Attorney, Agent, or Firm* — Edwards Neils LLC; Jean C. Edwards, Esq.

(57) ABSTRACT

To provide an optical waveguide having excellent adhesive properties with respect to a substrate, an epoxy resin photosensitive composition for an optical waveguide and a photosensitive film for an optical waveguide for fabricating the optical waveguide, and an opto-electric hybrid board including the optical waveguide.

7 Claims, 6 Drawing Sheets

(56) References Cited

U.S. PATENT DOCUMENTS

| | | | |
|---|---|---|---|
| 2012/0033913 A1 | 2/2012 | Kondou et al. | |
| 2015/0285995 A1 | 10/2015 | Yamamoto | |
| 2016/0070075 A1 | 3/2016 | Tsujita et al. | |
| 2016/0252655 A1 | 9/2016 | Hirayama et al. | |
| 2017/0291984 A1 | 10/2017 | Hirayama | |
| 2017/0349786 A1* | 12/2017 | Kim | C08G 77/16 |
| 2020/0071454 A1 | 3/2020 | Hirayama | |

FOREIGN PATENT DOCUMENTS

| | | |
|---|---|---|
| JP | 2009-029842 A | 2/2009 |
| JP | 2010-034207 A | 2/2010 |
| JP | 2010-230944 A | 10/2010 |
| JP | 2015-091910 A | 5/2015 |
| JP | 2016-084440 A | 5/2016 |
| JP | 2018-100357 A | 6/2018 |
| TW | 201441695 A | 11/2014 |
| TW | 201839049 A | 11/2018 |

OTHER PUBLICATIONS

International Search Report Issued in PCT/JP2019/046428 dated Feb. 10, 2020.
Written Opinion Issued in PCT/JP2019/046428 dated Feb. 10, 2020.
Office Action, issued by the Taiwanese Patent Office dated Aug. 15, 2023, in connection with Taiwanese Patent Application No. 108144963.
Office Action, issued by China National Intellectual Property Administration on Feb. 22, 2024, in connection with Chinese Patent Application No. 201980082488.8.

* cited by examiner

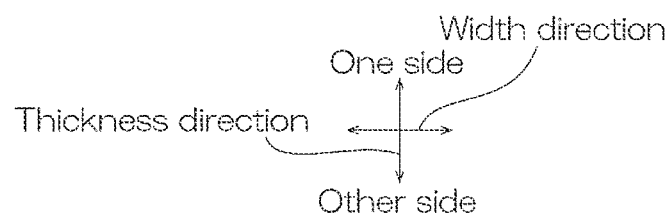
FIG. 1A
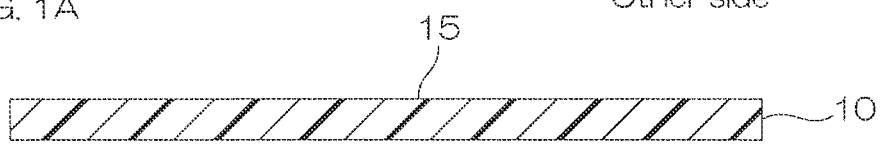
FIG. 1B
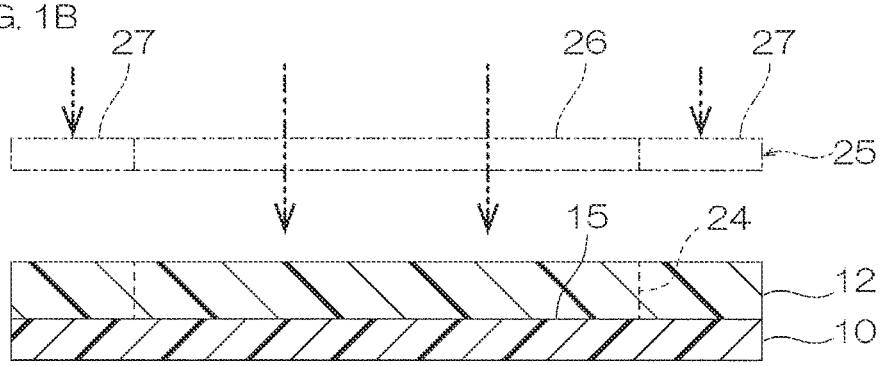
FIG. 1C
FIG. 1D
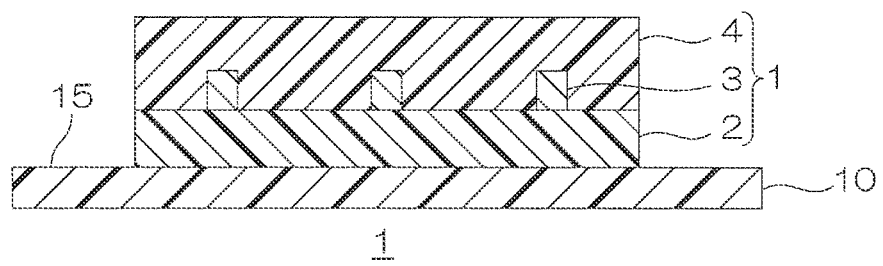

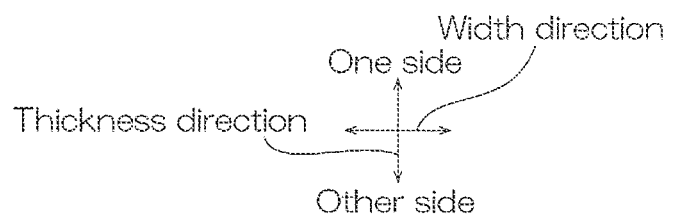
FIG. 2A
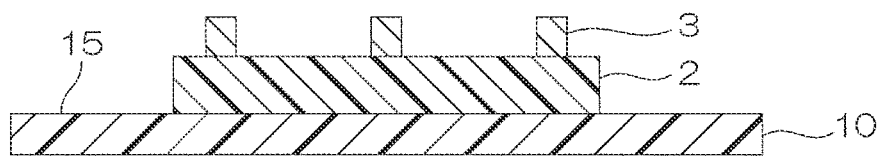
FIG. 2B
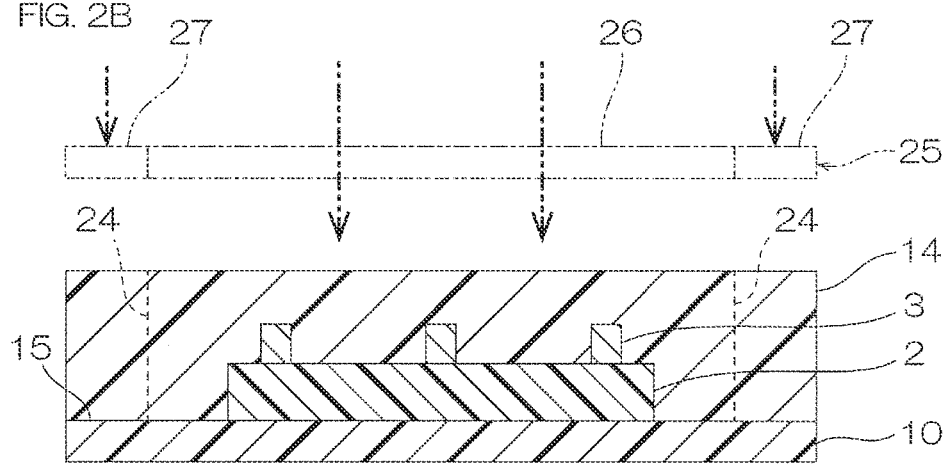
FIG. 2C
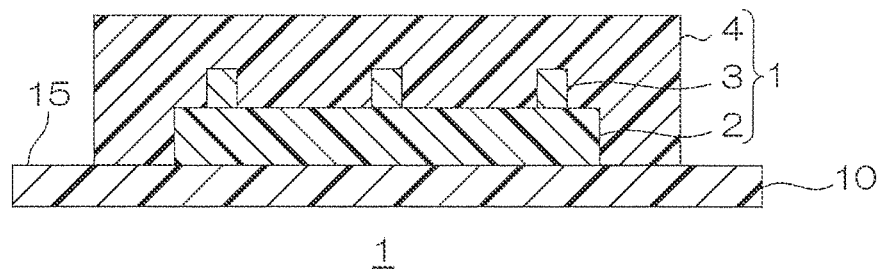

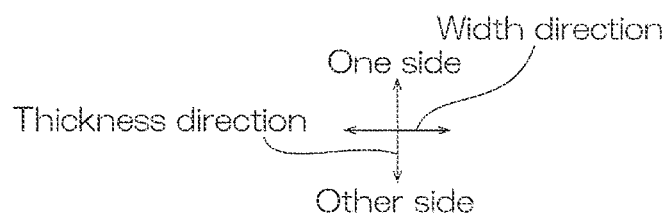
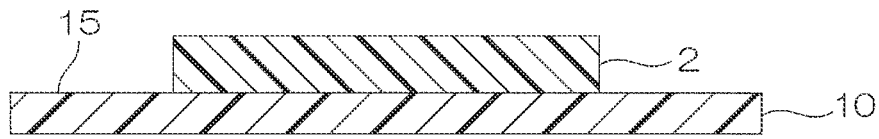
FIG. 3A
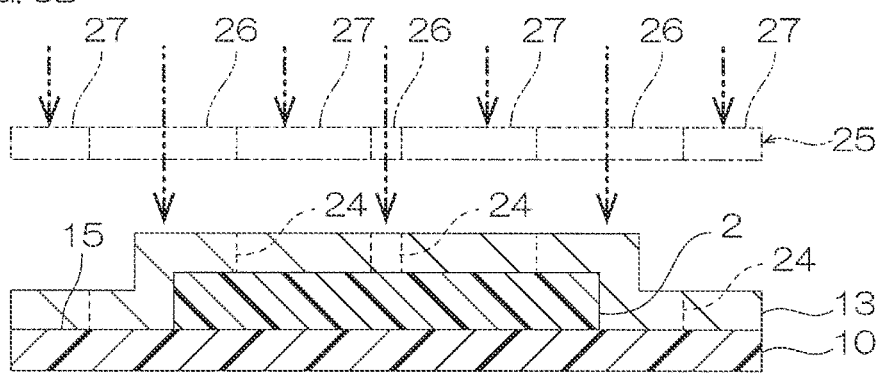
FIG. 3B
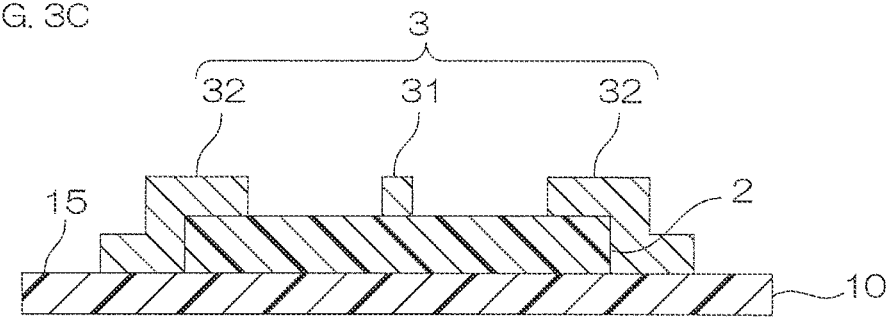
FIG. 3C
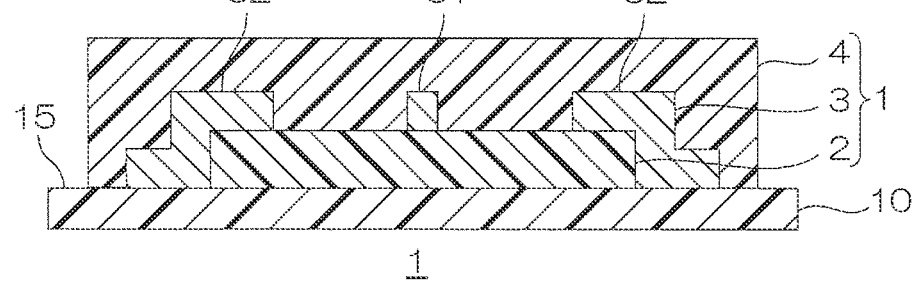
FIG. 3D

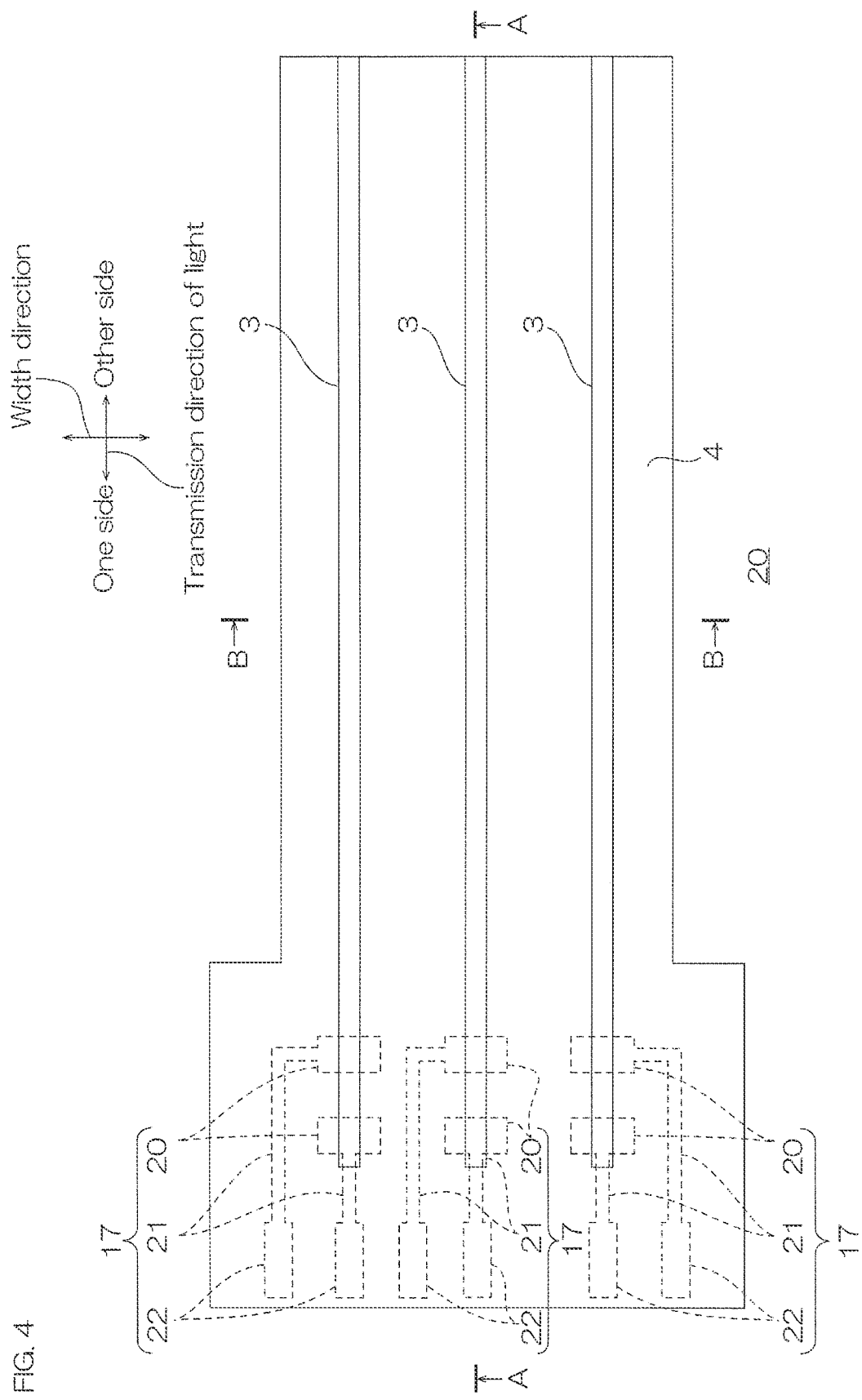

EPOXY RESIN PHOTOSENSITIVE COMPOSITION FOR OPTICAL WAVEGUIDE, PHOTOSENSITIVE FILM FOR OPTICAL WAVEGUIDE, OPTICAL WAVEGUIDE, AND OPTO-ELECTRIC HYBRID BOARD

CROSS-REFERENCE TO RELATED APPLICATIONS

The present application is a 35 U.S.C. 371 National Stage Entry of: PCT/JP2019/046428, filed on Nov. 27, 2019, which claims priority from Japanese Patent Application No. 2018-231451, filed on Dec. 11, 2018, the contents of all of which are herein incorporated by reference in their entirety.

TECHNICAL FIELD

The present invention relates to an epoxy resin photosensitive composition for an optical waveguide, a photosensitive film for an optical waveguide, an optical waveguide, and an opto-electric hybrid board.

BACKGROUND ART

Conventionally, it has been known that an optical waveguide is used for various optical applications.

For example, an optical waveguide obtained by applying an epoxy resin composition to the surface of a substrate such as a glass plate, followed by photo-processing to harm a pattern has been proposed (ref: for example, Patent Document 1 below).

Also, an optical waveguide obtained by applying an epoxy resin composition to the surface of a substrate on which an electric circuit is formed (electric circuit board), followed by photo-processing to form a pattern has been proposed (ref: for example, Patent Document 2 below).

CITATION LIST

Patent Document

Patent Document 1: Japanese Unexamined Patent Publication No, 2008-9150
Patent Document 2: Japanese Unexamined Patent Publication No. 2018-10035?

SUMMARY OF THE INVENTION

Problem to be Solved by the Invention

However, the optical waveguide requires excellent adhesive properties with respect to the substrate depending on the application and purpose. Patent Documents 1 and 2 also disclose a formulation in which a silane coupling agent is added to an epoxy resin. However, in this formulation, there is a problem that the above-described requirement cannot be sufficiently satisfied.

The present invention provides an optical waveguide having excellent adhesive properties with inspect to a substrate, an epoxy resin photosensitive composition for an optical waveguide and a photosensitive him for an optical waveguide for fabricating the optical waveguide, and an opto-electric hybrid board including the optical waveguide.

Means for Solving the Problem

The present invention [1] includes an epoxy resin photosensitive composition for an optical waveguide for forming an optical waveguide by being applied to a substrate and patterned by photo-processing including a hydrogenated alicyclic epoxy rosin represented by the following formula (1).

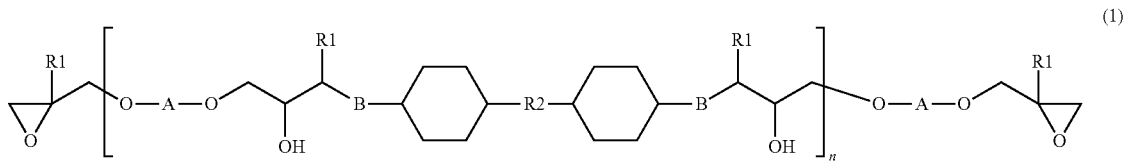

(1)

(In the formula, R1 represents a hydrogen atom or a methyl group. R2 represents at least one divalent group selected from the group consisting of —CH$_2$—, —C(CH$_3$)H—, —C(CH$_3$)$_2$—, and —SO$_2$—. A represents an arylene group having two or more branched alkyl groups having 4 or more carbon atoms as a substituent. B represents a divalent group represented by the following formula (2) or ether bonding. "n" represents a positive number.)

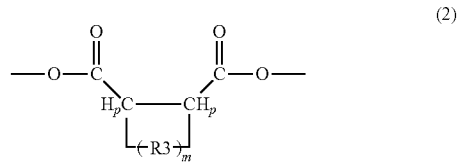

(2)

(In the formula, R3 represents an alkylene group which may have a substituent, "p" is 1 or 2. "m" is 0 or 1.)

The present invention [2] includes the epoxy resin photosensitive composition for an optical waveguide described in [1], wherein the hydrogenated alicyclic epoxy resin is represented by the following formula (3).

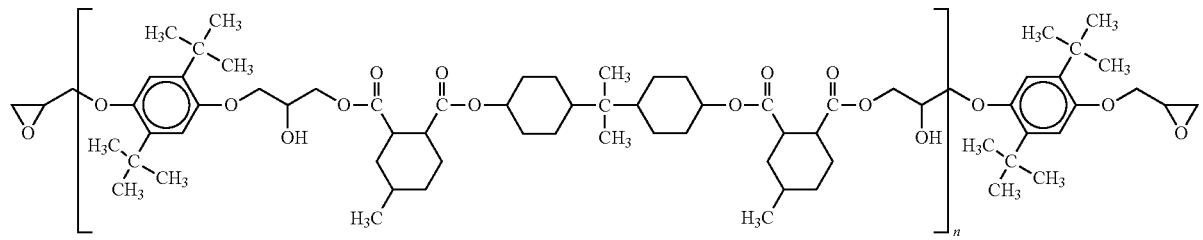

(3)

(In the formula, "n" represents a positive number.)

The present invention [3] includes the epoxy resin photosensitive composition for an optical waveguide described in [1] or [2] further including a polyfunctional epoxy resin having 3 or more epoxy groups and a photocationic polymerization initiator.

The present invention [4] includes the epoxy resin photosensitive composition for an optical waveguide described in any one of [1] to [3] used to form a clad included in the optical waveguide.

The present invention [5] includes the epoxy resin photosensitive composition for an optical waveguide described in any one of [1] to [4] used to form a core included in the optical waveguide.

The present invention [6] includes a photosensitive film for an optical waveguide obtained by applying the epoxy rosin photosensitive composition for an optical waveguide described in any one of [1] to [5] to a substrate.

The present invention [7] includes an optical waveguide which is a cared body of the photosensitive film for an optical waveguide described in [6].

The present invention [8] includes an opto-electric hybrid board including an electric circuit board and the optical waveguide described in [7].

Effect of the Invention

The optical waveguide of the present invention which is a cured body of the photosensitive film for an optical waveguide of the present invention obtained by applying the epoxy resin photosensitive composition for an optical waveguide of the present invention to a substrate has excellent adhesive properties with respect to the substrate. Therefore, the optical waveguide of tire present invention has excellent reliability.

Accordingly, since the opto-electric hybrid board of the present invention includes the above-described optical waveguide, it has excellent reliability.

BRIEF DESCRIPTION OF THE DRAWINGS

FIGS. 1A to 1D show a first embodiment in which an optical waveguide is formed from an epoxy resin photosensitive composition for an optical waveguide of the present invention:

FIG. 1A illustrating a step of preparing a substrate,

FIG. 1B illustrating a step of applying the epoxy resin photosensitive composition for an optical waveguide to the substrate and forming a photosensitive film for an under clad to be exposed, FIG. 1C illustrating a step of developing the photosensitive film for an under clad and forming an under clad, and FIG. 1D illustrating a step of form mg a core and an over clad and forming the optical waveguide.

FIGS. 2A to 2C show a second embodiment in which an optical waveguide is formed from an epoxy resin photosensitive composition for an optical waveguide of the present invention:

FIG. 2A illustrating a step of forming an under clad and a core on a substrate,

FIG. 2B illustrating a step of applying the epoxy resin photosensitive composition for an optical waveguide to the substrate, the under clad, and the core and forming a photosensitive film for an over clad to be exposed, and FIG. 2C illustrating a step of subsequently developing the photosensitive film for an over clad and forming an over clad to form the optical waveguide.

FIGS. 3A to 3D show a third embodiment in which an optical waveguide is formed from an epoxy resin photosensitive composition for an optical waveguide of the present invention:

FIG. 3A illustrating a step of forming an under clad on a substrate,

FIG. 3B illustrating a step of applying the epoxy resin photosensitive composition for an optical waveguide to the substrate and the under clad and forming a photosensitive film for a core to be exposed, FIG. 3C illustrating a step of developing the photosensitive film for a core and forming a core, and FIG. 3D illustrating a step of forming an over clad and forming the optical waveguide, FIG. 4 shows a plan view of one embodiment of an opto-electric hybrid board of the present invention.

FIG. 6A illustrating the opto-electric hybrid board along a B-B line of FIG. 4 and FIG. 6B illustrating a method for producing the opto-electric hybrid board shown in FIG. 6A.

DESCRIPTION OF EMBODIMENTS

Figure 5:
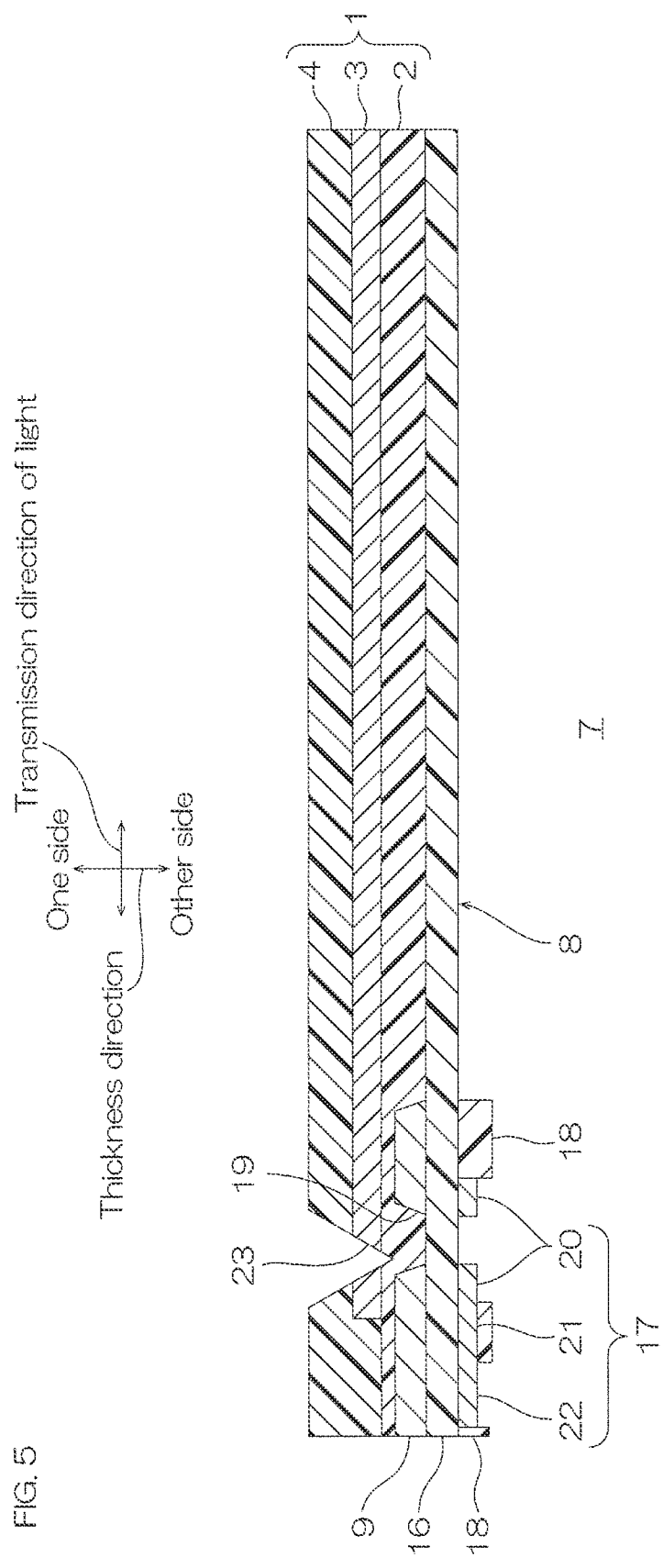
FIG. 5 shows a side cross-sectional view along an A-A line of FIG. 4.

<Epoxy Resin Photosensitive Composition for Optical Waveguide>

An epoxy resin photosensitive composition for an optical waveguide of the present invention is an epoxy resin photosensitive composition for an optical waveguide for forming an optical waveguide by being applied to a substrate and patterned by photo-processing.

The epoxy resin photosensitive composition for an optical waveguide includes a hydrogenated alicyclic epoxy resin represented by the following formula (1).

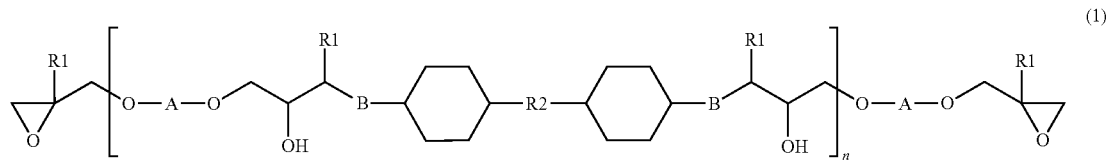

(1)

(In the formula, R1 represents a hydrogen atom or a methyl group. R2 represents at least one divalent group selected horn the group consisting of —CH₂—, —C(CH₃)H—, —C(CH₃)₂—, and —SO₂—. A represents an arylene group having two or more branched alkyl groups having 4 or more carbon atoms as a substituent. B represents a divalent group represented by the following formula (2) or ether bonding. "n" represents a positive number.)

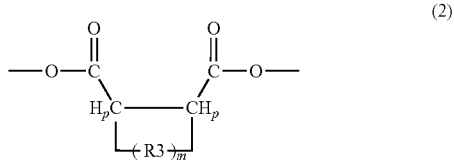

(2)

(In the formula, R3 represents an alkylene group winch may have a substituent, "p" is 1 or 2. "m" is 0 or 1.)

The hydrogenated alicyclic epoxy resin is an adhesive component which ensures excellent adhesive properties of the optical waveguide with respect to the substrate and is a main component (material) of a core and/or a clad.

R1s may be the same as or different from each other. As R1, preferably, a hydrogen atom is used.

In the formula (1), the structure shown by the following formula (4) is a flexible portion in tire hydrogenated alicyclic epoxy resin which reduces an elastic modulus of a photosensitive film for an optical waveguide to impart flexibility, thereby contributing to the improvement of the adhesive properties of the photosensitive film for an optical waveguide with respect to the substrate.

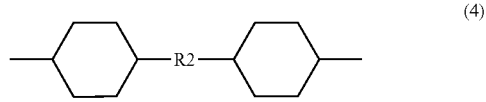

(4)

As R2, preferably, —CH₂— and —C(CH₃)₂— are used, more preferably, —C(CH₃)₂— is used.

In the formula (1), the arylene group represented by A is a rigid portion in the hydrogenated alicyclic epoxy resin winch ensures a high glass transition temperature of the photosensitive film for an optical waveguide, thereby developing shape (form) retaining properties of the photosensitive film for an optical waveguide.

The arylene groups represented by A may be the same or different from each other. An example of the arylene group represented by A includes a carbocyclic arylene group having 6 or more and 12 or less carbon atoms such as phenylene and naphthylene, and preferably, phenylene is used.

Examples of the branched alkyl group having 4 or more carbon atoms replaced with the arylene group represented by A include branched alkyl groups having 4 or more and 8 or less carbon atoms such as branched butyl such as isobutyl, sec-butyl, and tert-butyl, branched pentyl such as neopentyl, isopentyl, sec-pentyl, and tert-pentyl, branched hexyl such as tert-hexyl, branched heptyl such as tert-heptyl, and branched octyl such as tert-octyl.

As the branched alkyl group having 4 or more carbon atoms, preferably, branched butyl is used. Further, as the branched alkyl group having 4 or more carbon atoms, preferably, a tert-alkyl group is used.

As the branched alkyl group having 4 or more carbon atoms, more preferably, tert-butyl is used.

The number of substitutions of the branched alkyl group (the number of the branched alkyl groups as a substituent) may be one or more, and when it is a plurality; they may be the same or different from each other. Preferably, the number is two.

Specifically, as A, preferably, a 2,5-di(tert-butyl)phenylene is used.

Bs may be the same or different from each other. As B, preferably, a divalent group represented by the above-described formula (2) is used.

In the formula (2), an example of the alkylene group represented by R3 includes an alkylene group having 1 or more and 8 or less carbon atoms such as methylene, ethylene, propylene, iso-propylene, butylene, iso-butylene, sec-butylene, pentylene, iso-pentylene, sec-pentylene, hexylene, heptylene, and octylene. Preferably, an alkylene group having 2 or more and 6 or less carbon atoms is used, more preferably, an alkylene group having 3 or more and 5 or less carbon atoms is used, further more preferably, butylene is used.

An example of the substituent which may be substituted by the alkylene group includes an alkyl group, and preferably, an alkyl group having 1 or more and 3 or less carbon atoms such as methyl, ethyl, propyl, and isopropyl is used, more preferably, methyl is used.

The substituent (number of substitutions) is one or more, and is preferably one.

In the formula (2), when "m" is 0, "p" is 2 and when "m" is 1, "p" is 1. Also, the two "p"s are the same.

Preferably, "m" is 1 and "p" is 1.

In the formula (1), "n" is preferably 1 or more and 2 or less, and is particularly preferably 1.

Specifically, the hydrogenated alicyclic epoxy resin is preferably represented by fee following formula (5), and is more preferably represented by the following formula (6).

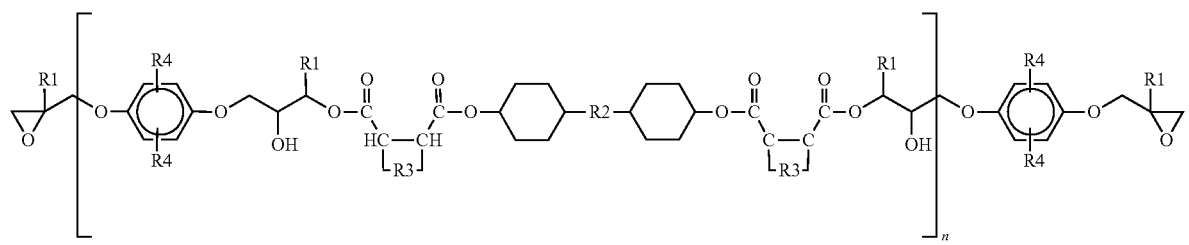

(5)

(In the formula, R1 represents a hydrogen atom or a methyl group. R2 represents at least one divalent group selected from the group consisting of —CH$_2$—, —C(CH$_3$)H—, —C(CH$_3$)$_2$—, and —SO$_2$—. R4 represents a branched alkyl group having 4 or more carbon atoms. R3 represents an alkylene group which may have a substituent. "n" is a positive number.)

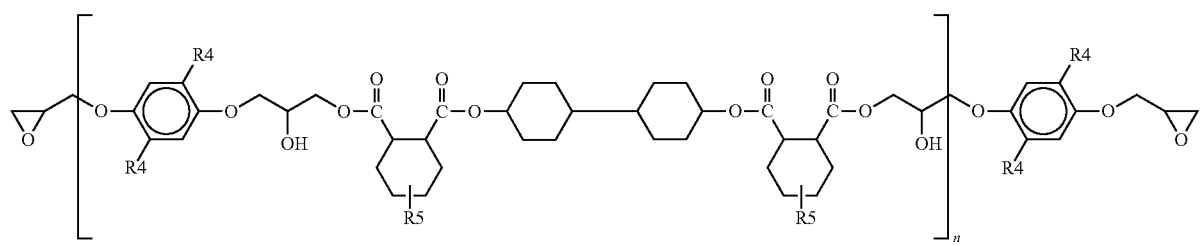

(6)

(R2 represents at least one divalent group selected from the group consisting of —CH$_2$—, —C(CH$_3$)H—, —C(CH$_3$)$_2$—, and —SO$_2$~. R4 represents a branched alkyl group having 4 or more carbon atoms. R5 represents an alkyl group having 1 or more and 3 or less carbon atoms. "n" is a positive number.) in the above-described formulas (5) and (6), R1, R2, and "n" are the same as those described in the above-described formula (1). The branched alkyl group having 4 or more carbon atoms represented by R4 is the same as that described in A in the above-described formula (1). R3 is the same as that described in the formula (2). R5 is the same as the substituent described in R3.

More preferably, the hydrogenated alicyclic epoxy resin is represented by the following formula (3).

more, and for example, 1000 g/eq or less, preferably 700 g/eq or less.

Further, a form of the hydrogenated alicyclic epoxy resin is not particularly limited, and may be, for example, any of solid, semi-solid, and liquid. Preferably, it is solid.

The above-described "solid", "semi-solid", and "liquid" mean a form at normal temperature, that is, at 25° C.

A content ratio of the hydrogenated alicyclic epoxy resin in the solid content of the epoxy resin photosensitive composition for an optical waveguide (excluding an organic solvent to be described later, and the main component constituting the resin in the photosensitive film for an optical waveguide (film)) is, for example, 5% by mass or more, preferably 15% by mass or more. When the content ratio of the hydrogenated alicyclic epoxy resin is the above-described lower limit or more, it is possible to improve the adhesive properties of the optical waveguide with respect to the substrate.

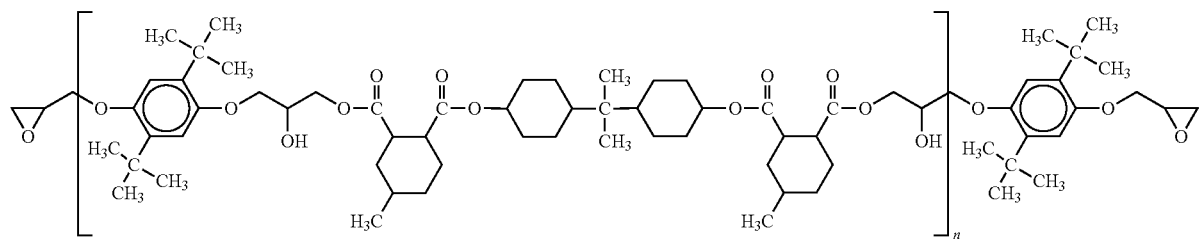

(3)

(In the formula, "n" represents a positive number.) An epoxy equivalent of the hydrogenated alicyclic epoxy resin is, for example, 300 g/eq or more, preferably 500 g/eq or Further, the content ratio of the hydrogenated alicyclic epoxy resin in the solid content of the epoxy resin photosensitive composition for an optical waveguide is, for example, 80% by mass or less, preferably 70% by mass or less. When the content ratio of the hydrogenated alicyclic epoxy resin is the above-described upper limit or less, another epoxy resin can be included at a sufficient content ratio, and a preferable function can be imparted to the optical waveguide. For example, when a polyfunctional epoxy resin (described later) is included in the epoxy resin photosensitive composition for an optical waveguide as another epoxy resin, high patterning properties can be imparted to the optical waveguide, and when a bifunctional epoxy resin (described later) is included in the epoxy resin photosensitive composition for an optical waveguide as another epoxy resin, flexibility can be imparted to the optical waveguide.

The epoxy resin photosensitive composition for an optical waveguide may further include a polyfunctional epoxy resin having 3 or more epoxy groups, and a photocationic polymerization initiator.

The polyfunctional epoxy resin having 3 or more epoxy groups is a cross-linking component which is cross-linked with the hydrogenated alicyclic epoxy resin, and is preferably blended into the epoxy resin photosensitive composition for an optical waveguide in order to form the optical waveguide as a cured product.

Examples of the polyfunctional epoxy resin include polyglycidyl ethers such as aromatic polyglycidyl ether (including cresol novolac-type epoxy resin), alicyclic polyglycidyl ether, and aliphatic polyglycidyl ether. Preferably, an aromatic polyglycidyl ether and an alicyclic polyglycidyl ether are used.

An example of the aromatic polyglycidyl ether includes an aromatic triglycidyl ether. Specifically, an example of the aromatic triglycidyl ether includes a trifunctional epoxy resin represented by the following formula (7) (for example, trade name: TECHMORE VG3101L, manufactured by Printec Corporation).

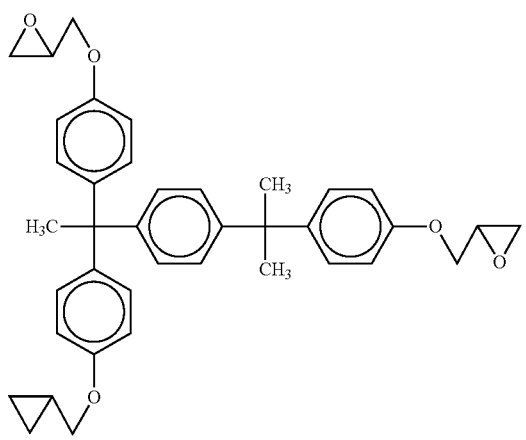

(7)

An example of the alicyclic polyglycidyl ether includes a polyfunctional epoxy resin represented by the following formula (8) (for example, trade name: EHPE3150, manufactured by Daicel Corporation).

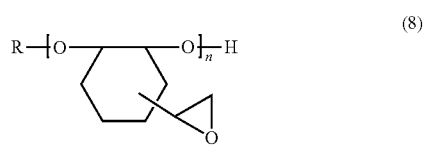

(8)

As the alicyclic triglycidyl ether represented by the formula (8), specifically, an adduct of a 1,2-epoxy-4-(2-oxiranyl)cyclohexane of a 2,2-bis(hydroxymethyl)-1-butanol is illustrated.

A form of the polyfunctional epoxy resin re not particularly limited, and may be, for example, any of solid, semisolid, and liquid. As the form of the polyfunctional epoxy resin, it is preferably solid. As long as the poly functional epoxy resin is solid, its softening point is, for example, 40° C. or more, preferably 50° C. or more, and for example, 110° C. or less, preferably 100° C. or less.

An epoxy equivalent of the polyfunctional epoxy resin is, for example, 100 g/eq or more, preferably 150 g/eq or more, and for example, 500 g/eq or less, preferably 250 g/eq or less.

These polyfunctional epoxy resins may be used alone or in combination.

A content ratio of the polyfunctional epoxy resin in the solid content of the epoxy resin composition for an optical waveguide is, for example, 5% by mass or more, preferably 10% by mass or more, and for example, 50% by mass or less, preferably 40% by mass or less. Further, the content ratio of the polyfunctional epoxy resin is, for example, 20 parts by mass or more, preferably 50 parts by mass or more, and for example, 200 parts by mass or less, preferably 100 parts by mass or less with respect to the solid content of 100 parts by mass of the hydrogenated alicyclic epoxy resin.

The photocationic polymerization initiator is a photoacid generator winch generates an acid by light irradiation, and cares a photosensitive film, for an optical waveguide (described later) by light irradiation (for example, ultraviolet ray irradiation). That is, the photocationic polymerization initiator is preferably blended into the epoxy resin photosensitive composition for an optical waveguide so as to form the optical waveguide with patterning by photo-processing of the photosensitive film for an optical waveguide.

Examples of the photocationic polymerization initiator include hexafluoroantimonium-based sulfonium salts such as triphenylsulfonium hexafluoroantimonate, p-(phenylthio) phenyldiphenylsulfonium hexafluoroantimonate, 4-chlorophenyldiphenylsulfonium hexafluoroantimonate, bis[4-(diphenylsulfonio)phenyl]sulfide bishexafluoroantimonate, and diphenyliodonium hexafluoroantimonate and hexafluorophosphate-based sulfonium salts such as triphenylsulfonium hexafluorophosphate, p-(phenylthio)phenyldiphenylsulfonium hexafluorophosphate, 4-chlorophenyldiphenylsulfonium hexafluorophosphate, bis [4-(diphenylsulfonio)phenyl]sulfide bishexafluorophosphate, and (2,4-cyclopentadiene-1-yl)[(1-methylethyl)benzene]-Fe-hexafluorophosphate. These photocationic polymerization initiators may be used alone or in combination of two or more.

As the photocationic polymerization initiator, preferably, a hexafluoroantimonium-based sulfonium salt is used, more preferably, triphenylsulfonium hexafluoroantimonate is used.

A content ratio of the photocationic polymerization initiator is, for example, 0.1 parts by mass or more, preferably 0.25 parts by mass or more, and for example, 10 parts by mass or less, preferably 5 parts by mass or less with respect to 100 parts by mass of the total sum of the hydrogenated alicyclic epoxy resin and the polyfunctional epoxy resin.

However, it is inappropriate that the epoxy resin photosensitive composition for an optical waveguide of the present invention includes a heating-type epoxy curing agent such as an acid anhydride compound and an imidazole compound which act on an epoxy group of the hydrogenated alicyclic epoxy resin (and the polyfunctional epoxy resin) by heating to accelerate a curing reaction instead of the photocationic polymerization initiator. The heating-type epoxy curing agent cannot be subjected to desired (refined appropriate for the optical waveguide) patterning by photo-processing. For example, drying and heating after application of the epoxy resin composition for an optical waveguide leads to unintentional progression of curing, or subsequent heating after exposure leads to progression of curing of both exposed and unexposed portions in the film for an optical waveguide with no progression of curing by photo-processing. Therefore, the film for an optical waveguide is not photosensitive. In other words, the epoxy resin composition for an optical waveguide including the heating-type epoxy curing agent is not a photosensitive composition which is photo-processable, and is not the epoxy resin photosensitive composition for an optical waveguide of the present invention.

The epoxy resin photosensitive composition for an optical waveguide may also further include another epoxy resin other than the hydrogenated alicyclic epoxy resin and the poly functional epoxy resin.

An example of the other epoxy resin includes a bifunctional epoxy resin having two epoxy groups.

The bifunctional epoxy resin is a bifunctional epoxy resin other than the above-described hydrogenated alicyclic epoxy resin, and is, for example, a flexible component winch imparts flexibility to the optical waveguide.

Examples of the bifunctional epoxy resin include bisphenol-type epoxy resins such as bisphenol A-type epoxy resin, bisphenol F-type epoxy resin, bisphenol E-type epoxy resin, and bisphenol S-type epoxy resin, and biphenyl-type epoxy resins, and preferably, a bisphenol-type epoxy resin is used. Further, examples of the bifunctional epoxy resin include solid epoxy resins (preferably, solid bisphenol-type epoxy resins) illustrated by YX-7180BH40 (manufactured by Mitsubishi Chemical Corporation) and jER1002 (manufactured by Mitsubishi Chemical Corporation), and liquid epoxy resins (preferably, liquid bisphenol-type epoxy resins) illustrated by jER-1002 (manufactured by Mitsubishi Chemical Corporation) and EXA4816 (manufactured by DIC Corporation). As the bifunctional epoxy resin, for example, a fluorene-type epoxy resin can be illustrated, and preferably, a liquid fluorene-type epoxy resin can be illustrated. The fluorene-type epoxy resin is blended into the epoxy resin composition for an optical waveguide to enhance the refractive index of the optical waveguide (specifically, the core (described later)).

These may be used alone or in combination of two or more.

Further, as the bifunctional epoxy resin, preferably, a semi-solid or solid epoxy resin is used. In a ease where the bifunctional epoxy resin is a semi-solid or solid epoxy resin, when the polyfunctional epoxy resin is in a liquid state, it is possible to ensure the shape retaining properties of the photosensitive film for an optical waveguide formed by application of the epoxy resin photosensitive composition for an optical waveguide.

An epoxy equivalent of the bifunctional epoxy resin is, for example, 100 g/eq or more, and 1000 g/eq or less.

A content ratio of the bifunctional epoxy resin in the solid content of the epoxy resin composition for an optical waveguide is, for example, 5% by mass or more, preferably 10% by mass or more, and for example, 80% by mass or less, preferably 70% by mass or less. Further, the content ratio of the bifunctional epoxy resin is, for example, 10 parts by mass or more, preferably 20 parts by mass or more, and for example, 300 parts by mass or less, preferably 200 parts by mass or less with respect to 100 parts by mass of the total sum of the hydrogenated alicyclic epoxy resin and the poly functional epoxy resin.

The epoxy resin photosensitive composition for an optical waveguide may further include an organic solvent, an antioxidant, another additive, and the like, if necessary.

When the epoxy resin photosensitive composition for an optical waveguide includes the organic solvent, it can be prepared as a varnish for forming a photosensitive film for an optical waveguide (hereinafter, referred to as a varnish).

Examples of the organic solvent include an ester compound (for example, ethyl lactate, propylene glycol methyl acetate, and the like), a ketone compound (for example, methyl ethyl ketone, cyclohexanone, 2-butanone, and the like), and an ether compound (for example, diglyme, diethylene glycol methyl ethyl ether, propylene glycol monomethyl ether, tetramethylfuran, dimethoxyethane, and the like). These organic solvents may be used alone or in combination of two or more. As the organic solvent, those blended into the above-described epoxy resin (specifically, a bifunctional epoxy resin) in advance are also included. As the organic solvent, preferably, an ester compound and a ketone compound are used. A content ratio of the organic solvent is, for example, 10% by mass or more, and for example, 50% by mass or less with respect to the epoxy resin photosensitive composition for an optical waveguide.

Examples of the antioxidant include a hindered phenol-based antioxidant and a phosphoric ester-based antioxidant. Examples of the additive include a leveling agent and a defoaming agent. A ratio of the antioxidant and the additive is appropriately set.

To prepare the epoxy resin photosensitive composition for an optical waveguide, each of the above-described components is blended and mixed. At this time, if necessary, heating can be carried out at, for example, 40° C. or more, preferably 80° C. or more, and for example, 120° C. or less. When the epoxy resin photosensitive composition for an optical waveguide includes an organic solvent, it is prepared as a varnish.

The optical waveguide prepared from the epoxy resin photosensitive composition for an optical waveguide (preferably, a varnish) includes a clad and/or a core. The clad also includes an under clad and an over clad.

For example, the photosensitive film for an optical waveguide which is prepared by applying the epoxy resin photosensitive composition for an optical waveguide to the substrate can be fabricated to obtain the optical waveguide which is a cured product thereof.

More specifically, a photosensitive film for an under clad prepared by applying the epoxy resin photosensitive composition for an optical waveguide to the substrate can be fabricated to obtain the under clad which is a cured product thereof (first embodiment to be described later).

A photosensitive film for an over clad prepared by applying the epoxy resin photosensitive composition for an optical waveguide to the substrate can be fabricated to obtain an over clad which is a cured product thereof (second embodiment to be described later).

A photosensitive film for a core prepared by applying the epoxy resin photosensitive composition for an optical waveguide to the substrate can be fabricated to obtain a core winch is a cured product thereof (third embodiment to be described later).

First Embodiment

Next, a first embodiment in which a photosensitive film for an under clad and an under clad are sequentially prepared by an epoxy resin photosensitive composition for an optical waveguide, and subsequently, an optical waveguide is formed is described with reference to FIGS. 1A to 1D.

First, as shown in FIG. 1A, a substrate 10 is prepared.

The substrate 10 has a Oat plate shape (sheet shape or him shape), and specifically, has a predetermined thickness, extends in a direction perpendicular to a thickness direction (plane direction), and has a flat one surface 15 and an other surface.

Examples of a material for the substrate 10 include polyesters such as polyethylene terephthalate, polyolefins such as polyethylene and polypropylene, and polymers such as polyamide. Also, examples of the material for the substrate 10 include metals such as stainless steel, iron, and copper and glass. A thickness of the substrate 10 is not particularly burned, and is, for example, 1 μm or more, preferably 10 μm or more, and for example, 10000 μm or less, preferably 1000 μm or less.

As shown in FIG. 1B, subsequently, an epoxy resin photosensitive composition for an optical waveguide (preferably, a varnish) is applied to the entire one surface 15 of the substrate 10 using a known application device (applicator and the like).

Subsequently, when the epoxy resin photosensitive composition for an optical waveguide is a varnish, an organic solvent is removed by heating and drying. A heating temperature is, for example, 80° C. or more, preferably 100° C. or more, and for example, 150° C. or less. The heating tune is, for example, 1 minute or more, and for example, 60 minutes or less.

Thus, a photosensitive film 12 for an under clad as one example of a photosensitive film for an optical waveguide is formed (fabricated) from the epoxy resin photosensitive composition for an optical waveguide on the one surface 15 of the substrate 10.

The photosensitive film 12 for an under clad has a film shape extending along a transmission direction of light in an optical waveguide 1 (described later) (depth direction on the plane of the sheet in FIGS. 1A to 1D), and has a flat one surface and a flat other surface (two main surfaces) facing each other in the thickness direction. The photosensitive film 12 for an under clad is a photosensitive film for forming an under clad 2 (ref FIG. 1C) by photo-processing, and is a precursor film of the under clad 2.

As shown by a phantom line and arrows of FIG. 1B, an ultraviolet ray is irradiated to the photosensitive film 12 for an under clad via a photomask 25.

The photomask 25 has a pattern having a transmission portion 26 corresponding to the under clad 2, and a light shielding portion 27 winch is capable of blocking the ultraviolet my.

By irradiating the ultraviolet ray to the photosensitive film 12 for an under clad via the above-described photomask 25, the ultraviolet ray is transmitted through the transmission portion 26, and a portion corresponding to the under clad 2 in the photosensitive film 12 for an under clad is exposed (photosensitive).

An irradiation amount of the ultraviolet ray is, for example, 10 mJ/cm$^2$ or more, preferably 100 mJ/cm$^2$ or more, and for example, 20000 mJ/cm$^2$ or less, preferably 10000 mJ/cm$^2$ or less.

Thereafter, if necessary, heating after exposure is carried out. A temperature of the heating after exposure is, for example, 70° C. or more, preferably 90° C. or more, and for example, 250° C. or less, preferably 150° C. or less. The time of the heating after exposure is, for example, 10 seconds or more, preferably 5 minutes or more, and for example, 2 hours or less, preferably 1 hour or less.

As a result, the above-described portion of the photosensitive film 12 for an under clad is cured (completely cured), and a latent image 24 (phantom line) of the under clad 2 is formed. Still, curing does not progress in an unexposed portion in the photosensitive film 12 for an under clad, that is, a portion facing the light shielding portion 27 in the photosensitive film 12 for an under clad.

Thereafter, as shown in FIG. 1C, the unexposed portion in the photosensitive film 12 for an under clad is removed by development. Thus, the photosensitive film 12 for an under clad is patterned, and the under clad 2 which is a cured body thereof is formed on the one surface 15 of foe substrate 10.

The refractive index of the under clad 2 is, for example, 1.560 or less, preferably, 1.554 or less. A thickness of the under clad 2 is, for example, 20 μm or more, and for example, 4000 μm or less.

As shown in FIG. 1D, thereafter, a core 3 and an over clad 4 are formed on one surface of the under clad 2 by a known method. The core 3 is formed on one surface of the under clad 2 in a predetermined pattern. The refractive index of the core 3 is larger than that of the under clad 2 and that of the over clad 4 (described later). Specifically, the refractive index of the core 3 is, for example, 1.575 or more, preferably 1.580 or more. A thickness of the core 3 is, fen example, 10 μm or more, and 2000 μm or less.

The over clad 4 is disposed on one surface of the under clad 2 so as to cover the side surfaces (both side surfaces facing each other in a width direction perpendicular to the transmission direction of the light and the thickness direction) and one surface of the core 3. The refractive index of the over clad 4 is lower than that of the core 3, and is preferably the same as that of the under clad 2. A thickness of the over clad 4 is the same as that of the under clad 2.

An example of a material for the core 3 and the over clad 4 includes a known (photosensitive) material for an optical waveguide.

Thus, the optical waveguide 1 which includes the under clad 2, the core 3, and the over clad 4 and in which the under clad 2 is in contact with the one surface 15 of the substrate 10 is produced. The optical waveguide 1 is a strip-type optical waveguide. A thickness of the optical waveguide 1 is, for example, 40 μm or more, and tor example, 8000 μm or less.

Then, the under clad 2 (one example of an optical waveguide) winch is a cured body of the photosensitive film 12 for an under clad (one example of a photosensitive film for an optical waveguide) prepared by applying the epoxy resin photosensitive composition for an optical waveguide to the substrate 10 has excellent adhesive properties with respect to the substrate 10.

Therefore, the optical waveguide 1 including the under clad 2 has excellent reliability.

Modified Example of First Embodiment

In the modified example of the first embodiment, the material for the core 3 and/or the over clad 4 may be the epoxy resin photosensitive composition for an optical waveguide of the present invention. In the modified example, the same function and effect as that of the first embodiment can be achieved.

Second Embodiment

In the second embodiment, the same reference numerals are provided for members and steps corresponding to each of those in the first embodiment and the modified example thereof and their detailed description is omitted. Further, the second embodiment can achieve the same function and effect as that of the first embodiment and the modified example thereof unless otherwise specified. Furthermore, the first embodiment, the second embodiment, and the modified examples thereof can be appropriately used in combination.

Next, a second embodiment in which a photosensitive film for an over clad and an over clad are sequentially prepared by the epoxy resin photosensitive composition for an optical waveguide, and subsequently, an optical waveguide is formed is described with reference to FIGS. 2A to 2C.

As shown in FIG. 2A, first, the substrate 10 is prepared, and subsequently, the under clad 2 and the core 3 are sequentially formed from a known (photosensitive) material for an optical waveguide by a known method.

As shown in FIG. 2B, next, the epoxy resin photosensitive composition for an optical waveguide (preferably, a varnish) is applied to the one surface 15 of the substrate 10, the side surfaces and one surface of the under clad 2, and the side surfaces and one surface of the core 3.

Subsequently, when the epoxy resin photosensitive composition for an optical waveguide is a varnish, an organic solvent is removed by heating and drying.

Thus, a photosensitive film 14 for an over clad as one example of a photosensitive film for an optical waveguide is formed (fabricated) from the epoxy resin photo sensitive composition for an optical waveguide on the one surface 15 of the substrate 10, the side surfaces and one surface of the under clad 2, and the side surfaces and one surface of the core 3.

The photosensitive film 14 for an over clad has a film shape extending along the transmission direction of the light in the optical waveguide 1 (depth direction on the plane of the sheet in FIGS. 2A to 2C), and has a flat one surface and a flat other surface (two main surfaces) facing each other in the thickness direction. The photosensitive film 14 for an over clad is a photosensitive film for forming the over clad 4 by photo-processing, and is a precursor film of the over clad 4. Both end portions in the width direction of the other surface of file photosensitive film 14 for an over clad are in contact with the one surface 15 exposed from the under clad 2 in a light transmitting substrate film 1.

Next, as shown by the phantom line and the arrows of FIG. 2B, an ultraviolet ray is irradiated to the photosensitive film 14 for an over clad via the photomask 25. The transmission portion 26 has a pattern corresponding to the over clad 4 (ref: FIG. 2C).

By irradiating the ultraviolet ray to the photosensitive film 14 for an over clad via the above-described photomask 25, the ultraviolet ray is transmitted through the transmission portion 26, and a portion corresponding to the over clad 4 in the photosensitive film 14 for an over clad is exposed (photosensitive).

As a result, the above-described portion of the photosensitive film 14 for an over clad is cured, and the latent image 24 (phantom line) of the over clad 4 is formed. Thereafter, heating after exposure is carried out to cure (completely cure) the above-described portion of the photosensitive film 14 for an over clad.

Thereafter, as shown in FIG. 2C, an unexposed portion (portion surrounding the over clad 4) is removed by development. As a result, the photosensitive film 14 for an over clad is patterned to form the over clad 4 which is a cured body thereof on the one surface 15 of the substrate 10, the side surfaces and one surface of the under clad 2, and the side surfaces and one surface of the core 3.

Thus, the optical waveguide 1 which includes the under clad 2, the core 3, and the over clad 4 and in which both end portions in the width direction of the over clad 4 are in contact with the one surface 15 of the substrate 10 is produced.

Then, the over clad 4 (one example of an optical waveguide) winch is a cured body of the photosensitive film 14 for an over clad (one example of a photosensitive film for an optical waveguide) prepared by applying the epoxy resin photosensitive composition for an optical waveguide to the substrate 10 has excellent adhesive properties with respect to the one surface 15 of the substrate 10.

Therefore, the optical waveguide 1 including the over clad 4 has excellent reliability.

Modified Example of Second Embodiment

In the modified example of the second embodiment, the material for the under clad 2 and/or the core 3 may be the epoxy resin photosensitive composition for an optical waveguide of the present invention. In the modified example, the same function and effect as that of the second embodiment can be achieved.

Preferably, the materials for the under clad 2 and the over clad 4 are the epoxy resin photosensitive composition for an optical waveguide of the present invention. According to this formulation, since the under clad 2 and the over clad 4 are in contact with the one surface 15 of the substrate 10, the optical waveguide 1 including these has further more excellent reliability.

Third Embodiment

In the third embodiment, the same reference numerals are provided for members and steps corresponding to each of those in the first embodiment, the second embodiment and the modified examples thereof and their detailed description is omitted. Further, the third embodiment can achieve the same function and effect as that of the first embodiment, the second embodiment, and the modified examples thereof unless otherwise specified. Furthermore, the first to the third embodiments and the modified examples thereof can be appropriately used in combination.

Next a third embodiment in which a photosensitive film for a core and a core are sequentially prepared by the epoxy resin photosensitive composition tor an optical waveguide, and subsequently, an optical waveguide is formed is described with reference to FIGS. 3A to 3D.

As shown in FIG. 3A, first, the substrate 10 is prepared, and subsequently, the under clad 2 is formed from a known (photosensitive) material for an optical waveguide by a known method.

As shown in FIG. 3B, next, the epoxy resin photosensitive composition for an optical waveguide (preferably, a varnish) is applied to the one surface 15 of the substrate 10, and the side surfaces and one surface of the under clad 2.

Subsequently, when the epoxy resin photosensitive composition for an optical waveguide is a varnish, an organic solvent is removed by heating and drying.

Thus, a photosensitive film 13 for a core as one example of a photosensitive film for an optical waveguide is formed (fabricated) from the epoxy resin photosensitive composition for an optical waveguide on the one surface 15 of the substrate 10, and the side surfaces and one surface of the under clad 2.

The photosensitive film 13 for a core has a film shape extending along the transmission direction of the light in the optical waveguide 1 (depth direction on the plane of the sheet in FIGS. 3A to 3D), and has one surface and the other surface (two main surfaces) feeing each other in the thickness direction. The photosensitive film 13 fora core is a photosensitive film for forming the core 3 by photo-processing, and is a precursor film of the core 3. A portion of the other surface of the photosensitive film 13 for a core is in contact with the one surface 15 exposed from the under clad 2 in the light transmitting substrate film 1.

Next, as shown by the phantom line and the arrows of FIG. 3B, an ultraviolet ray is irradiated to the photosensitive film 13 for a core via the photomask 25. The transmission portion 26 has a pattern corresponding to the core 3. The core 3 includes a first core 31 (described later) which is formed on only one surface of the under clad 2, and a second core 32 (described later) which is formed over one surface and the side surfaces of the under clad 2, and the one surface 15 of the substrate 10.

By irradiating the ultraviolet ray to the photosensitive film 13 for a core via the above-described photomask 25, the ultraviolet ray is transmitted through the transmission portion 26, and a portion corresponding to the core 3 (the first core 31 and the second core 32 to be described later) in the photosensitive film 13 for a core is exposed (photosensitive).

As a result, the epoxy resin photosensitive composition for an optical waveguide in the above-described portion is cured, and the core 3 which is a cured body of the epoxy resin photosensitive composition for an optical waveguide is formed as the latent image 24 (phantom line). Thereafter, heating after exposure is carried out to cure (completely cure) the above-described portion of the photosensitive film 13 for a core.

Thereafter, as shown in FIG. 3C, the unexposed portion (portion surrounding the over clad 4) is removed by development. That is, the core 3 is patterned from the photosensitive film 13 for a core.

Thus, the core 3 including the first core 31 and the second core 32 is formed (patterned).

The first core 31 is formed on one surface of an intermediate portion of the under clad 2 in the width direction.

The second core 32 is disposed at spaced intervals to the first core 31 in the width direction. The second core 32 is continuously formed on one surfaces and the side surfaces of both end portions in the width direction of the under clad 2, and the one surface 15 of the substrate 10. The second cote 32 has, for example, a Z-shape in a cross-sectional view. The other surface in the thickness direction of the outer-side portion in the width direction of the second core 32 is in contact with the one surface 15 of the substrate 10.

As shown in FIG. 3D, thereafter, the over clad 4 is formed from a known material on the one surface 15 of the substrate 10 so as to cover the under clad 2 and the core 3.

Thus, the optical waveguide 1 winch includes the under clad 2, the core 3 (the first core 31 and the second core 32), and the over clad 4 and in which the second core 32 is in contact with the one surface 15 of the substrate 10 is produced.

Then, the core 3 (specifically, the second core 32) (one example of an optical waveguide) which is a cured body of the photosensitive film 13 fora core (one example of a photosensitive film for an optical waveguide) prepared by applying the epoxy resin photosensitive composition for an optical waveguide to the substrate 10 has excellent adhesive properties with respect to the substrate 10.

Therefore, the core 3 has excellent reliability.

Modified Example of Third Embodiment

In the modified example of the thud embodiment, the material for the under clad 2 and/or the over clad 4 may be the epoxy resin photosensitive composition for an optical waveguide of the present invention, in the modified example, the same function and effect as that of the third embodiment can be achieved.

Preferably, the materials for the under clad 2, the core 3, and the over clad 4 are the epoxy resin photosensitive composition for an optical waveguide of the present invention.

According to this formulation, since the under clad 2, the core 3, and the over clad 4 are in contact with the one surface 15 of the substrate 10, the optical waveguide 1 including these has remarkably excellent reliability.

<Opto-Electric Hybrid Board>

Next, one embodiment of an opto-electric hybrid board of the present invention is described with reference to FIGS. 4 to 6A.

As shown in FIGS. 4A to 6, an opto-electric hybrid board 7 has a generally flat plate shape extending in the transmission direction of the light. The opto-electric hybrid board 7 includes an electric circuit board 8 as one example of a substrate, and the optical waveguide 1 in order toward one side in the thickness direction.

As shown in FIG. 5, the electric circuit board 8 includes a metal support layer 9, a base insulating layer 16, a conductive layer 17, and a cover insulating layer 18, and preferably, consists of only them.

The metal support layer 9 is a reinforcement layer for reinforcing the conductive layer 17. The metal support layer 9 is provided in one end portion in the transmission direction of the electric circuit board 8. An example of a material for the metal support layer 9 includes a metal such as stainless steel. The metal support layer 9 has a plurality of (three) opening portions 19 corresponding to the plurality of (three)

cores 3 to be described later. The opening portion 19 penetrates the metal support layer 9 in the thickness direction.

The base insulating layer 16 is an insulating layer for insulating the metal support layer 9 from the conductive layer 17, and is located between the metal support layer 9 and the conductive layer 17 in the thickness direction of the electric circuit board 8. Specifically, the base insulating layer 16 is disposed on the other surface in the thickness direction of the metal support layer 9. The base insulating layer 16 extends over the entire electric circuit board 8. An outer shape of the base insulating layer 16 is, for example, the same as the outer shape of the opto-electric hybrid board 7. An example of a material for the base insulating layer 16 includes a resin such as polyimide.

The conductive layer 17 is a signal layer for transmitting electricity (electrical signals) between an external circuit board (not shown) surd an optical element (not shown). The conductive layer 17 is disposed on the other surface in the thickness direction of the base insulating layer 16. The conductive layer 17 is provided in one end portion in the transmission direction of the electric circuit board 8. An example of a material for the conductive layer 17 includes a conductor such as copper.

As shown in FIGS. 4 and 5, the conductive layer 17 has a pattern shape having a first terminal 20, a second terminal 22, and a wiring 21 for electrically connecting the first terminal 20 to the second terminal 22. The two (one pair of) first terminals 20 are provided for each of the plurality of cores 3 to be described later. The plurality of second terminals 22 are provided corresponding to each of the plurality of first terminals 20, and are electrically connected to the respective first terminals 20 by the wiring 21.

The cover insulating layer 18 is disposed on the other surface in the thickness direction of the base insulating layer 16 so as to cover the wiring 21, and expose the first terminal 20 and the second terminal 22. An example of a material for the cover insulating layer 18 includes a resin such as polyimide.

Figure 6A:
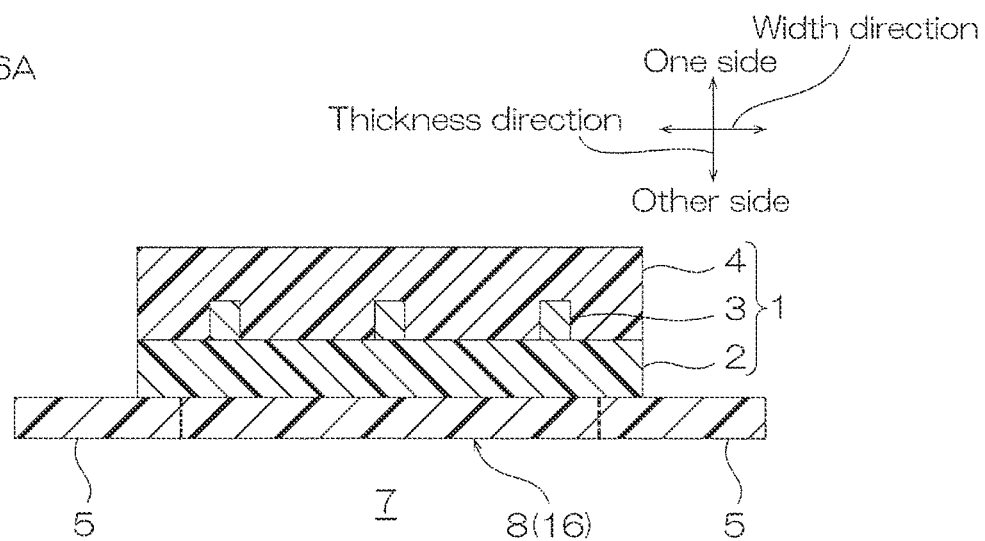
FIGS. 6A and 6B show front cross-sectional views for illustrating one embodiment of an opto-electric hybrid board of the present invention and a producing method thereof.

As shown in FIGS. 4 and 6A, an example of the optical waveguide 1 includes a strip-type optical waveguide illustrated in the first embodiment, and the optical waveguide 1 includes the under clad 2, the core 3, and the over clad 4 described above.

The under clad 2 is disposed on one surface in the thickness direction of the metal support layer 9 and one surface in the thickness direction exposed from the metal support layer 9 in the base insulating layer 16. The plurality of (three) cores 3 are disposed in alignment at spaced intervals to each other in the width direction.

The core 3 has a mirror surface 23. The mirror surface 23 is formed by cutting out the core 3, and is, for example, a slope forming an angle of 45 degrees with respect to a direction in which the core 3 extends. The mirror surface 23 is located in the opening portion 19 of the metal support layer 9 when projected in the thickness direction.

Figure 6B:
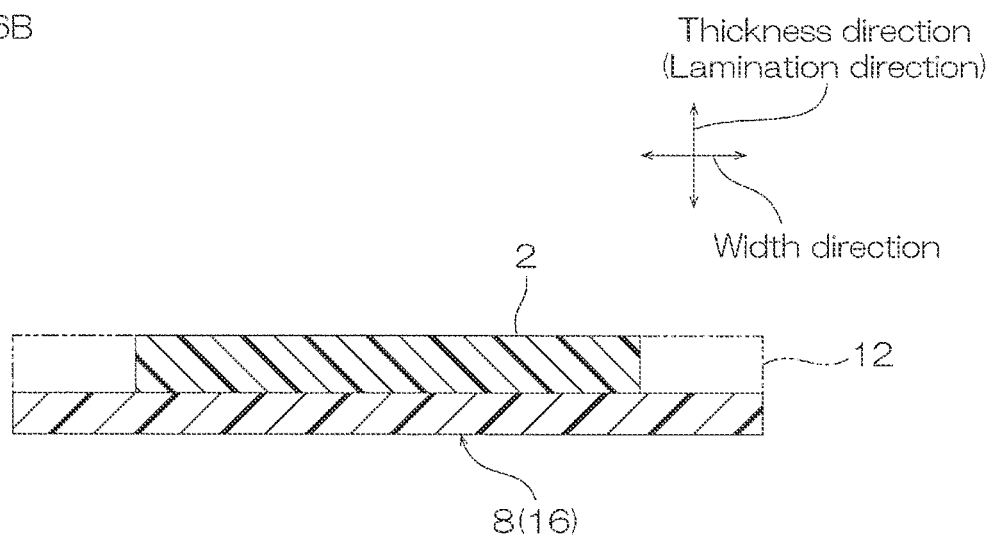

As shown in FIG. 6B, in order to produce the opto-electric hybrid board 7, first, the electric circuit board 8 is produced, and then, the optical waveguide 1 is fabricated (manufactured) on one surface in the thickness direction of the electric circuit board 8.

To fabricate the optical waveguide 1, first, the epoxy resin photosensitive composition for an optical waveguide is applied to the entire one surface in the thickness direction of the electric circuit board 8. Thus, the photosensitive film 12 for an under clad (phantom line) is formed on one surface in the thickness direction of the electric circuit board 8.

Thereafter, the photosensitive film 12 for an under clad is exposed via a photomask which is not shown, and subsequently, is subjected to heating after exposure and development (patterning), so that the under clad 2 (solid line) having the above-described pattern is formed.

As shown in FIG. 6A, thereafter, the core 3 and the over clad 4 are formed on one surface of the under clad 2 by a known method, and as shown in FIG. 5, then, the mirror surface 23 is formed on the core 3.

Thereafter, as shown by a broken line of FIG. 6A, if necessary, by removing (cutting out) both end portions 5 in the width direction of the electric circuit board 8 along the transmission direction, both end edges in the width direction of the optical waveguide 1 are exposed from the opto-electric hybrid board 7.

Then, since the opto-electric hybrid board 7 includes the optical waveguide 1 corresponding to the first embodiment, it has excellent adhesive strength of the under clad 2 with respect to one surface of the electric circuit board 8.

Therefore, since the opto-electric hybrid board 7 includes the above-described electric circuit board 8, it has excellent reliability.

Modified Examples of One Embodiment

In the above-described description, the optical waveguide 1 corresponding to the first embodiment is fabricated on one surface of the electric circuit board 8. Alternatively, for example, the optical waveguide 1 corresponding to the second embodiment or the third embodiment can be also fabricated on one surface of the electric circuit board 8 to produce the opto-electric hybrid board 7. This modified example can achieve the same function and effect as that of one embodiment.

Further, the electric circuit board 8 is illustrated as one example of a substrate on which the optical waveguide 1 is provided. Alternatively, it may be also a substrate other than the electric circuit board 8, for example, a substrate having no electric circuit (the substrate 10 described above).

EXAMPLES

Next, the present invention is further described based on Examples and Comparative Examples below. The present invention is however not limited by Examples and Comparative Examples. The specific numerical values in mixing ratio (ratio), property value, and parameter used in the following description can be replaced with upper limit values (numerical values defined as "or less" or "below") or lower limit values (numerical values defined as "or more" or "above") of corresponding numerical values in mixing ratio (ratio), property value, and parameter described in the above-described "DESCRIPTION OF EMBODIMENTS".

Each of the components of Examples and Comparative Examples is described in detail below.

Hydrogenated alicyclic epoxy resin: represented by formula (3), solid, epoxy equivalent of 540 g/eq

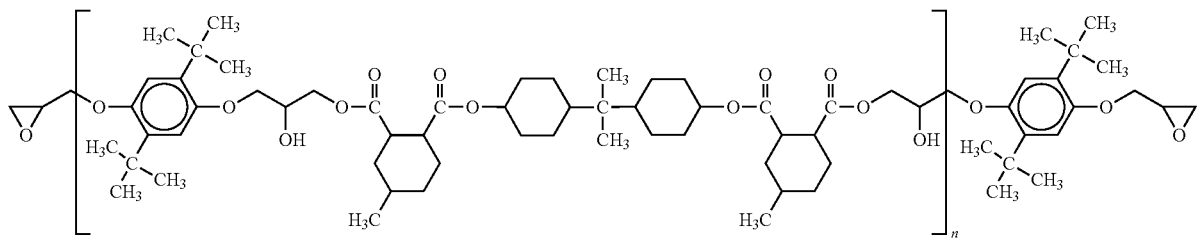

(3)

(In the formula, "n" is 1.)

VG3101L: solid aromatic triglycidyl ether represented by the following formula (7), softening point of 60%), epoxy equivalent of 205 to 215 g/eq (manufactured by Printec (Corporation)

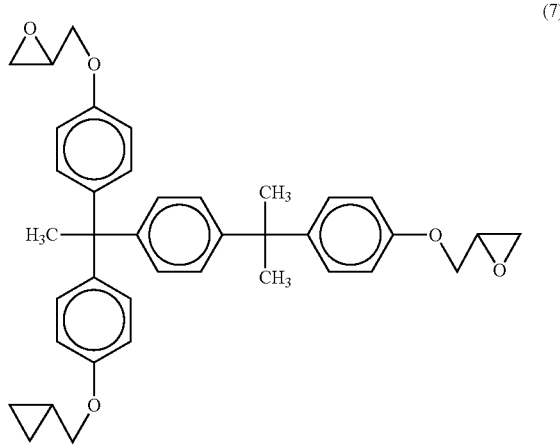

(7)

EHPE3150: alicyclic polyglycidyl ether represented by the following formula (8), softening point of 70 to 90° C., epoxy equivalent of 170 to 190 g/eq (manufactured by Daicel Corporation)

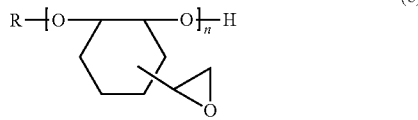

(8)

YX7180BH40: 40% by mass of solution of cyclohexanone and methyl ethyl ketone (1/1) of semi-solid bifunctional epoxy resin (manufactured by Mitsubishi Chemical Corporation)

jER-1002: solid bifunctional epoxy resin (bisphenol A, epoxy equivalent of 600 to 700 g/eq) (manufactured by Mitsubishi Chemical Corporation)

EXA4816: liquid bifunctional epoxy resin (bisphenol-type epoxy resin, softening point of 78° C. epoxy equivalent of 403 g/eq) (manufactured by DIC Corporation)

OGSOL PG100: solid bifunctional fluorene-type epoxy resin (manufactured by Osaka Gas Chemicals Co., Ltd.)

KBM403: epoxy-based silane coupling agent (manufactured by Shin-Etsu Chemical Co., Ltd.)

CPI-101A: photocationic polymerization initiator (triphenylsulfonium hexafluoroantimonate) (manufactured by New Japan Chemical Co., Ltd.)

RIKACID MH700: heating-type epoxy resin curing agent (4-methylhexahydrophthalic anhydride/hexahydrophthalic anhydride) (mass ratio=70/30)

Examples 1 to 5 and 7, and Comparative Example 1

Under light shielding conditions, each of the mixing components shown in Table 1 was simultaneously blended according to its mixing formulation and dissolved during heating at 110° C. In YX7180BH40, it was blended so that the solid content thereof was the amount described in Table 1.

Thereafter, the mixture was cooled to room temperature (25° C.), and heated and pressure filtered using a membrane filter having a diameter of 1.0 μm to fabricate a varnish.

<Fabrication of Samples>

As shown in FIG. 1B, a varnish was applied to the entire one surface 15 of the substrate 10 made of stainless steel using an applicator to prepare a coating him, and subsequently, the coating him was dried by beating at 130° C. for 10 minutes (organic solvent was removed) to form a photosensitive him having a thickness of 50 μm.

As shown by a phantom line of FIG. 1B, subsequently, the photomask 25 having the transmission portion 26 having a rectangular pattern of a width of 3 mm×a length of 40 mm, and the light shielding portion 27 located around the transmission portion 26 was disposed at one side in the thickness direction of the photosensitive him to be exposed (photosensitive) at 4000 mJ/cm$^2$ (integrated with a wavelength of 365 nm) with a UV emitter [high-pressure mercury lamp, total light ray (without a band-pass filter)]. As a result, the latent image 24 of an under clad sample to be described later was formed.

Subsequently, heating after exposure was carried out at 140° C. for 10 minutes, and thereafter, it was developed with a developer (γ-butyrolactone) for 3 minutes.

Thus, as shown in FIG. 1C, the under clad sample in a rectangular shape and having a size of a width of 3 mm×a length of 40 mm was fabricated on the one surface 15 of the substrate 10.

Example 6

The process was carried out in the same manner as in Example 1, except that the sample obtained after development was changed to a core sample.

Comparative Example 2

An under clad sample was attempted to fabricate in the same manner as in Example 1.

However, thermal curing progressed by drying and heating of a coating film. Thereafter, even when the photo-processing was carried out, a latent image teas not formed, and then, an under clad sample was formed on the entire one surface 15 of the substrate 10 by heating after exposure. That is, the under clad sample did not have a rectangular pattern having a size of a width of 3 mm×a length of 40 mm.

Evaluation

The following items were evaluated. The results are shown in Table 1.

<Peel Test (Evaluation of Adhesive Properties)>

Each of the samples (under clad sample, core sample) of Examples 1 to 7 and Comparative Example 1 was peeled from the one surface 15 of the substrate 10 at 90 degrees and a rate of 10 mm/min to measure a peel strength. The peel strength was evaluated based on the following criteria.

Excellent: peel strength of 500 mN/cm or more

Good: peel strength of 200 mN/cm or more and below 500 mN/cm

Bad: peel strength of below 200 mN/cm

<Patterning Properties of Photo-Processing>

The patterning properties of the photosensitive film in the photo-processing were evaluated based on the following criteria.

Excellent: a sample could be fabricated in the same pattern as the transmission portion 26 of the photomask 25.

Bad: a sample could not be fabricated in the same pattern as the transmission portion 26 of the photomask 25.

TABLE 1

| Mixing Formulation (Numerical Values in parts by mass) | Kind | Formula/Trade Name etc. | Examples 1 | 2 | 3 | 4 | 5 | 6 | 7 | Comparative Examples 1 | 2 |
|---|---|---|---|---|---|---|---|---|---|---|---|
| Adhesive Component | Solid Hydrogenated Alicyclic Epoxy Resin | Formula (3) | 40 | 60 | 20 | 40 | 40 | 40 | 10 | — | 40 |
| Cross-Linking Component | Solid Aromatic Triglycidyl Ether | VG3101L | 20 | 20 | 20 | 20 | 20 | 20 | 20 | 20 | 20 |
|  | Solid Alicyclic Polyglycidyl Ether | EHPE3150 | — | — | — | 20 | — | — | — | — | — |
| Flexible Component | Semi-Solid Bifunctional Epoxy Resin | YX7180BH40 (Solid Content) | 20 | 20 | 20 | 20 | 20 | 20 | 20 | 20 | 20 |
|  | Solid Bifunctional Epoxy Resin | jER-1002 | 20 | — | 40 | — | — | — | 50 | 60 | 20 |
|  | Liquid Bifunctional Epoxy Resin | EXA4816 | — | — | — | — | 20 | — | — | — | — |
|  | Solid Bifunctional Fluorene-Type Epoxy Resin | OGSOL PG100 | — | — | — | — | — | 20 | — | — | — |
| Epoxy-Based Silane Coupling Agent | | KBM403 | — | — | — | — | — | — | — | 3 | — |
| Photocationic Polymerization Initiator | | CPI-101A | 2 | 2 | 2 | 2 | 2 | 2 | 2 | 2 | — |
| Heating-Type Epoxy Curing Agent | Acid Anhydride | RIKACID MH700 | — | — | — | — | — | — | — | — | 34 |
| Organic Solvent | | Ethyl Lactate | 23 | 23 | 23 | 23 | 23 | 23 | 23 | 23 | 23 |
| Evaluation | Corresponding Photosensitive Film (Photosensitive Film for Under Clad/Photosensitive Film for Core) | | For Under Clad | For Under Clad | For Under Clad | For Under Clad | For Under Clad | For Core | For Under Clad | For Under Clad | For Under Clad |
|  | Peel Test | | Excellent | Excellent | Excellent | Excellent | Excellent | Excellent | Good | Bad | — |
|  | Patterning Properties of Photo-Processing | | Excellent | Excellent | Excellent | Excellent | Excellent | Excellent | Excellent | Excellent | Bad |

While the illustrative embodiments of the present invention are provided in the above description, such is for illustrative purpose only and it is not to be construed as limiting the scope of the present invention. Modification and variation of the present invention that will be obvious to those skilled in the art is to be coveted by the following claims.

INDUSTRIAL APPLICATION

The epoxy resin photosensitive composition for an optical waveguide of the present invention is used in the production of an optical waveguide.

DESCRIPTION OF REFERENCE NUMBER

1 Optical waveguide
2 Under clad (one example of clad)
2 Core
4 Over clad tone example of clad)
7 Opto-electric hybrid board
8 Electric circuit board
10 Substrate
12 Photosensitive film tor under clad (one example of photosensitive film for optical waveguide)
13 Photosensitive film for core tone example of photosensitive film for optical waveguide)
14 Photosensitive film for over clad (one example of photosensitive film for optical waveguide)
32 Second core

The invention claimed is:

1. An epoxy resin photosensitive composition for an optical waveguide for forming an optical waveguide by being applied to a substrate and patterned by photo-processing comprising:
a hydrogenated alicyclic epoxy resin represented by the following formula (1);
a polyfunctional epoxy resin having 3 or more epoxy groups; and
a photocationic polymerization initiator,
wherein the polyfunctional epoxy resin having 3 or more epoxy groups is a cross-linking component which is cross-linked with the hydrogenated alicyclic epoxy resin, and is blended into the epoxy resin photosensitive composition for an optical waveguide in order to form the optical waveguide as a cured product,
wherein the polyfunctional epoxy resin is at least one selected from the group consisting of an aromatic polyglycidyl ether and an alicyclic polyglycidyl ether,
wherein a content ratio of the polyfunctional epoxy resin is 20 parts by mass or more and 200 parts by mass or less with respect to a solid content of 100 parts by mass of the hydrogenated alicyclic epoxy resin,
wherein formula 1 is:

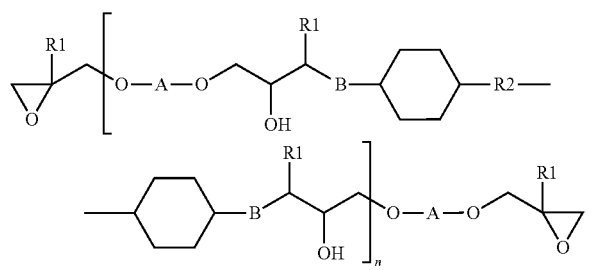

wherein:
R1 represents a hydrogen atom or a methyl group;
R2 represents at least one divalent group selected from the group consisting of $-CH_2-$, $-C(CH_3)H-$, $-C(CH_3)_2-$, and $-SO_2-$;
A represents an arylene group having two or more branched alkyl groups having 4 or more carbon atoms as a substituent;
B represents a divalent group represented by the following formula (2) or ether bonding;
"n" represents a positive number, and
wherein formula (2) is:

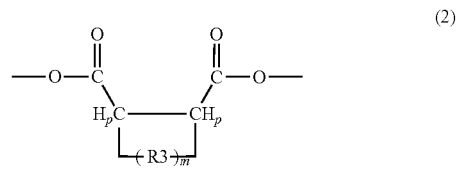

wherein R3 represents an alkylene group which may have a substituent;
"p" is 1 or 2;
"m" is 0 or 1.

2. The epoxy resin photosensitive composition for an optical waveguide according to claim 1, wherein the hydrogenated alicyclic epoxy resin is represented by the following formula (3);

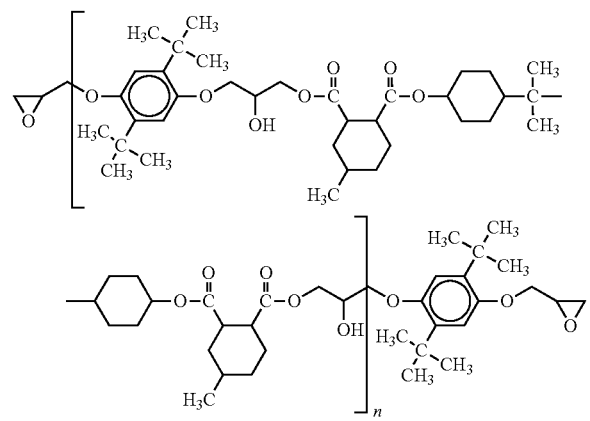

wherein "n" represents a positive number.

3. The epoxy resin photosensitive composition for an optical waveguide according to claim 1 used to form a clad included in the optical waveguide.

4. The epoxy resin photosensitive composition for an optical waveguide according to claim 1 used to form a core included in the optical waveguide.

5. A photosensitive film for an optical waveguide obtained by applying the epoxy resin photosensitive composition for an optical waveguide according to claim 1 to a substrate.

6. An optical waveguide being a cured body of the photosensitive film for an optical waveguide according to claim 5.

7. An opto-electric hybrid board comprising:
an electric circuit board and
the optical waveguide according to claim 6.

* * * * *